(12) United States Patent
Lee et al.

(10) Patent No.: US 11,405,540 B2
(45) Date of Patent: Aug. 2, 2022

(54) CAMERA MODULE

(71) Applicant: Samsung Electronics Co., Ltd., Gyeonggi-do (KR)

(72) Inventors: Gwan Yong Lee, Gyeongsangbuk-do (KR); Cheol Hwang, Gyeongsangbuk-do (KR); Dohyun Ahn, Gyeongsangbuk-do (KR)

(73) Assignee: Samsung Electronics Co., Ltd

( * ) Notice: Subject to any disclaimer, the term of this patent is extended or adjusted under 35 U.S.C. 154(b) by 191 days.

(21) Appl. No.: 16/473,113

(22) PCT Filed: Nov. 16, 2017

(86) PCT No.: PCT/KR2017/013010
§ 371 (c)(1),
(2) Date: Jun. 24, 2019

(87) PCT Pub. No.: WO2018/117429
PCT Pub. Date: Jun. 28, 2018

(65) Prior Publication Data
US 2019/0349507 A1 Nov. 14, 2019

(30) Foreign Application Priority Data

Dec. 23, 2016 (KR) .................... 10-2016-0178091

(51) Int. Cl.
*H04N 5/225* (2006.01)
*H05K 3/34* (2006.01)
(Continued)

(52) U.S. Cl.
CPC ............. *H04N 5/2257* (2013.01); *G02B 7/02* (2013.01); *H04N 5/2252* (2013.01);
(Continued)

(58) Field of Classification Search
CPC .. H04N 5/2257; H04N 5/2252; H04N 5/2253; H04N 5/335; G02B 7/02;
(Continued)

(56) References Cited

U.S. PATENT DOCUMENTS

| 7,186,924 B2* | 3/2007 | Geva | H05K 1/0219 |
| | | | 174/255 |
| 2005/0285973 A1* | 12/2005 | Singh | H04N 5/2253 |
| | | | 348/374 |

(Continued)

FOREIGN PATENT DOCUMENTS

| JP | 2008282916 A | * 11/2008 |
| KR | 100674833 | 1/2007 |

(Continued)

OTHER PUBLICATIONS

PCT/ISA/210 Search Report issued on PCT/KR2017/013010 (pp. 5).
PCT/ISA/237 Written Opinion issued on PCT/KR2017/013010 (pp. 6).

*Primary Examiner* — Sinh Tran
*Assistant Examiner* — Zhenzhen Wu
(74) *Attorney, Agent, or Firm* — The Farrell Law Firm, P.C.

(57) ABSTRACT

A printed circuit board of a camera module according to various embodiments of the disclosure includes: a ground portion constructed on the printed circuit board; a conductive member which is disposed to cover the ground portion and includes a first opening at a location corresponding to the ground portion; and an adhesive layer which is interposed between the printed circuit board and the conductive member and includes a second opening at a location corresponding to the ground portion, wherein the conductive member may be electrically coupled to the ground portion (Continued)

through a solder constructed on the first opening and the second opening. Other embodiments are also possible.

13 Claims, 8 Drawing Sheets

(51) Int. Cl.
*H05K 1/02* (2006.01)
*G02B 7/02* (2021.01)
*H04N 5/335* (2011.01)
*H05K 1/11* (2006.01)
*H05K 1/18* (2006.01)
*H05K 3/28* (2006.01)

(52) U.S. Cl.
CPC ......... *H04N 5/2253* (2013.01); *H04N 5/335* (2013.01); *H05K 1/0272* (2013.01); *H05K 1/118* (2013.01); *H05K 1/181* (2013.01); *H05K 3/28* (2013.01); *H05K 3/34* (2013.01)

(58) Field of Classification Search
CPC ...... H05K 1/0272; H05K 1/118; H05K 1/181; H05K 3/28; H05K 3/34; H05K 1/0298; H05K 1/028; H05K 3/10; H05K 3/38
See application file for complete search history.

(56) References Cited

U.S. PATENT DOCUMENTS

| | | | |
|---|---|---|---|
| 2006/0181633 A1* | 8/2006 | Seo | H04N 5/2253 348/E5.025 |
| 2008/0143871 A1* | 6/2008 | Go | H04N 5/2257 348/E5.025 |
| 2010/0103296 A1 | 4/2010 | Nakagiri et al. | |
| 2010/0158508 A1 | 6/2010 | Kim | |
| 2011/0051390 A1* | 3/2011 | Lin | H01L 27/14625 361/818 |
| 2015/0264806 A1* | 9/2015 | Happoya | H05K 1/0298 174/251 |
| 2016/0064332 A1* | 3/2016 | Kao | H01L 21/32134 257/774 |
| 2017/0280554 A1* | 9/2017 | Toyoshima | H05K 3/4655 |
| 2017/0295642 A1* | 10/2017 | Codd | H05K 1/0215 |
| 2020/0322513 A1* | 10/2020 | Yang | H04N 5/2257 |

FOREIGN PATENT DOCUMENTS

| | | |
|---|---|---|
| KR | 1020080089692 | 10/2008 |
| KR | 100867513 | 11/2008 |
| KR | 1020090128374 | 12/2009 |
| KR | 1020100001809 | 1/2010 |
| KR | 101462727 | 11/2014 |

* cited by examiner

CAMERA MODULE

PRIORITY

This application is a National Phase Entry of PCT International Application No. PCT/KR2017/013010, which was filed on Nov. 16, 2017, and claims priority to Korean Patent Application No. 10-2016-0178091, which was filed on Dec. 23, 2016, the content of each of which are incorporated herein by reference.

BACKGROUND

1. Field

Various embodiments of the disclosure relate to a camera module, and more particularly, to a ground structure of the camera module.

2. Description of the Related

Today, portable terminals such as mobile phones, tablet Personal Computers (PCs), or the like are used as multi-convergence not only with simple telephone functions but also with music, movies, Televisions (TVs), games, or the like due to the recent technological development. A camera module is one of the most representative elements which lead to the development of the multi-convergence. The camera module is being improved to implement various additional functions such as Auto Focusing (AF), optical zoom, or the like while being capable of acquiring a high-quality image. In addition, since the portable terminal is becoming small in size, components such as a camera module, an antenna, or the like are also becoming small in size and being implemented with high density.

However, various problems may arise in the development of a compact camera module and in the structure in which the camera module is disposed adjacent to components such as an antenna or the like in the portable terminal. For example, there may be a problem in that a resolution deteriorates since an optical axis is misaligned between an image sensor and a lens, and there may be problem in that Electro-Magnetic Interference (EMI) generated mutually between the antenna and the camera module causes a negative effect to each other.

Various embodiments of the disclosure provides a camera module in which an image sensor can be reliably mounted on a printed circuit board despite flexibility, by disposing a conductive member on the printed circuit board having an image sensor mounted thereon.

In addition, various embodiments of the disclosure provide a camera module with improved EM Susceptibility (EMS), by providing a ground structure through an electrical connection to a ground portion of a printed circuit board while attaching the conductive member to the printed circuit board using a non-conductive adhesive layer.

SUMMARY

According to various embodiments of the disclosure, a camera module may include a printed circuit board, a ground portion constructed on the printed circuit board, a conductive member which is disposed to cover the ground portion and includes a first opening at a location corresponding to the ground portion, and an adhesive layer which is interposed between the printed circuit board and the conductive member and includes a second opening at a location corresponding to the ground portion. The conductive member may be electrically coupled to the ground portion through a solder constructed on the first opening and the second opening.

According to various embodiments of the disclosure, a camera module may include a printed circuit board, a ground portion constructed on the printed circuit board, a conductive member which is disposed to cover the ground portion and includes an opening at a location corresponding to the ground portion, and an adhesive layer which is interposed between the printed circuit board and the conductive member and does not overlap with the ground portion. The conductive member may be electrically coupled to the ground portion through a solder constructed on the opening.

In a camera module according to various embodiments of the disclosure, a slim camera module can be provided by attaching a conductive member to a printed circuit board using a non-conductive adhesive layer which is thinner than the conductive adhesive layer. In addition, by improving an inclination phenomenon caused by thickness deviation, positional deviation, and shift, the non-conductive adhesive layer can enhance a resolution of the camera module.

Advantages acquired in the disclosure are not limited to the aforementioned advantages. Other advantages not mentioned herein can be clearly understood by those skilled in the art to which the disclosure pertains from the following descriptions.

DETAILED DESCRIPTION

Figure 1:
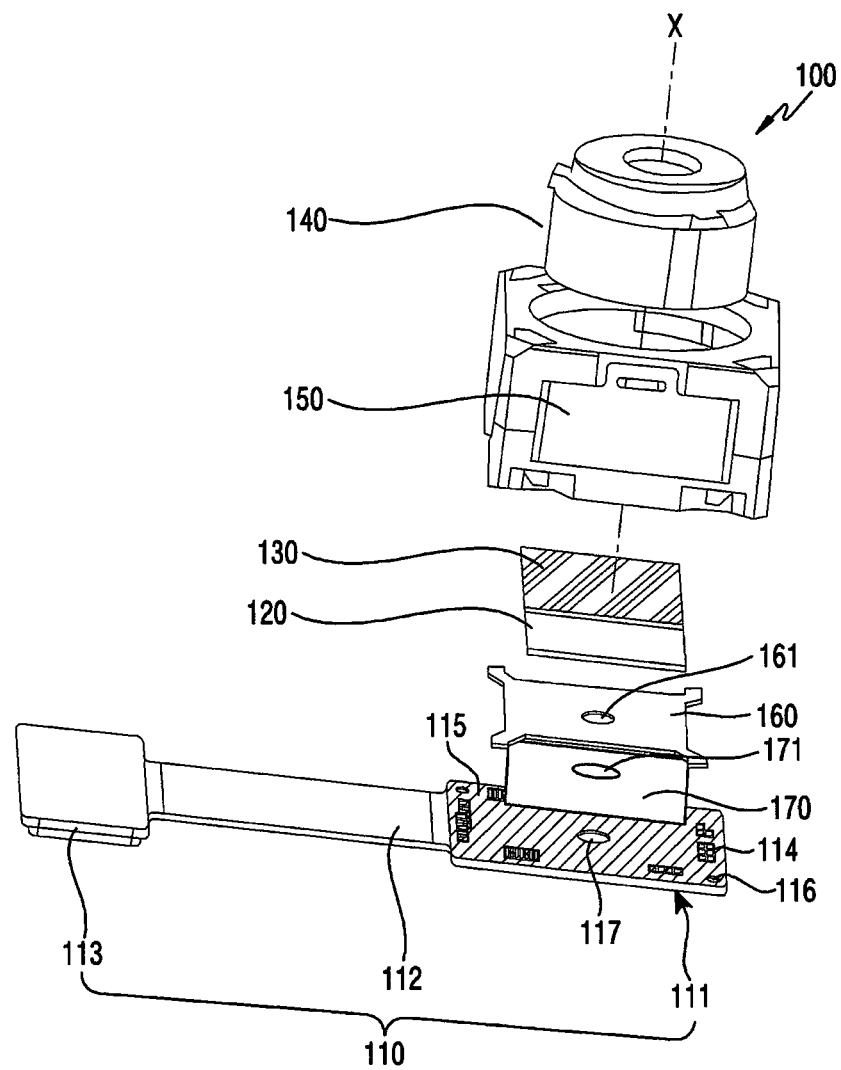
FIG. 1 is an exploded perspective view illustrating a camera module according to various embodiments of the disclosure.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An expression "have", "may have", "include" or "may include" or the like used in the disclosure is intended to indicate a presence of a corresponding characteristic (e.g., a number, a function, an operation, or a component such as a component), and should be understood that there are additional possibilities of one or more other characteristics.

In the disclosure, an expression "A or B", "A and/or B", or "one or more of A and/or B" or the like may include all possible combinations of items enumerated together. For example, "A or B", "at least one of A and B", or "at least one of A or B" may indicate all cases where: (1) at least one A is included; (2) at least one B is included; and (3) at least one A and at least one B are both included.

Although expressions such as "$1^{st}$", "$2^{nd}$", "first", and "second" may be used in various embodiments to express various components, it is not intended to limit the corresponding components. The above expressions may be used to distinguish one component from another component. For example, a $1^{st}$ user device and a $2^{nd}$ user device are both user devices, and indicate different user devices. For example, a $1^{st}$ component may be termed a $2^{nd}$ component, and similarly, the $2^{nd}$ component may be termed the $1^{st}$ component without departing from the scope of the disclosure.

When a certain component (e.g., the $1^{st}$ component) is mentioned as being "operatively or communicatively coupled with/to" or "connected to" a different component (e.g., the $2^{nd}$ component), it is to be understood that the certain component is directly coupled with/to another component or can be coupled with/to the different component via another component (e.g., a $3^{rd}$ component). On the other hand, when the certain component (e.g., the $1^{st}$ component) is mentioned as being "directly coupled with/to" or "directly connected to" the different component (e.g., the $2^{nd}$ component), it may be understood that another component (e.g., the $3^{rd}$ component) is not present between the certain component and the different component.

An expression "configured to" used in the disclosure may be interchangeably used with, for example, "suitable for", "having the capacity to", "designed to", "adapted to", "made to", or "capable of" according to a situation. A term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

Terms used in the disclosure are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the disclosure should not be interpreted to exclude the embodiments of the disclosure.

FIG. 1 is an exploded perspective view illustrating a camera module according to various embodiments of the disclosure. Referring to FIG. 1, the camera module 100 may include a Printed Circuit Board (PCB) 110, an image sensor 120 mounted on one end portion of the PCB 110, an optical filter member 130, a lens assembly 140, a housing 150, and a conductive member 160. The PCB 110 may be a flexible PCB. The housing 150 may be constructed in a vertical tubular shape to provide an inner space in which various components of the camera module 100 are assembled. A substrate 111 of the PCB 110 may be fixedly coupled to cover an open lower face of the housing 150. The image sensor 120 may be mounted on an upper face of the PCB 110. In addition, the optical filter member 130 and the lens assembly 140 may be mounted inside the housing 150.

The PCB 110 according to various embodiments may include the substrate 111, a connection portion 112, and a connector 113. The connector 113 of the PCB 110 may receive an electrical image signal, which is generated by the image sensor 120 mounted on the substrate 111, through the connection portion 112. The connector 113 may be connected to an external circuit to provide the electrical image signal generated by the image sensor 120 to the external circuit, e.g., a main circuit board. According to various embodiments, the substrate 111 of the PCB 110 may have a variety of electronic components mounted thereon. For example, the substrate 111 of the PCB 110 may include a plurality of bonding pads 114, a coupling hole 116, and a ground portion 117 on an upper face. Each of the plurality of bonding pads 114 may be electrically coupled with the image sensor 120 through wire bonding or the like. That is, the bonding pad 114 may be electrically coupled sequentially to the connection portion 112 and the connector 113 through a circuit layer in the PCB 110. The coupling hole 116 may provide assembling of the substrate 111 and the housing 150. For example, the housing 150 may be fixedly coupled with the substrate 111 by means of a coupling pin fastened to the coupling hole 116. In addition, the housing 150 may be fixedly coupled using an adhesive on an upper face of the substrate 111. For example, the adhesive may include an epoxy resin or a non-conductive adhesive. For another example, the coupling may be achieved using a conductive adhesive. In this case, the housing 150 may be electrically coupled to the substrate 111 through the conductive adhesive. The conductive adhesive may include Ag-epoxy, solder paste, or the like.

The PCB has a physical property capable of preventing damage by properly changing a shape against an external impact due to excellent flexibility, but has a disadvantage in that it does not have appropriate rigidity and hardness for reliably mounting various components. When the image sensor is directly mounted on a flexible substrate, the substrate may be bent due to the external impact. When the substrate is bent, light received from a lens and the image sensor 120 mounted on the conductive member 160 is misaligned to an optical axis X of the image sensor, and there may be a problem of deterioration in the resolution of the entire image processed by the image sensor or the resolution of a specific corner. In order to compensate for this, the PCB may include a coating layer on a surface to have specific rigidity and hardness. For example, in the camera module 100 according to various embodiments of the disclosure, the substrate 111 of the PCB 110 may have a coating layer 115 constructed on a surface. The coating layer 115 may provide rigidity and hardness for reliably mounting the image sensor 120. Alternatively, the coating layer 115 may provide rigidity and hardness for reliably coupling the housing 150, which includes the optical filter member 130 and the lens assembly 140, and the substrate 111 constructed as the PCB. In other words, the image sensor 120, the housing 150, or the like may be reliably mounted on the substrate 111 due to rigidity and hardness provided by the coating layer 115. The coating layer 115 may be constructed not to block an electrical and/or physical connection path between the PCB and another electronic component. For example, the coating layer 115 may be constructed to include an opening for exposing the bonding pad 114, the coupling hole 116, the ground portion 117, or the like. For example, the coating layer may be constructed through Photo imageable Solder Resist (PSR) printing process. In the opening of the coating layer 115, when the PSR printing process is performed on the substrate 111, the process may be performed after attaching a diazo film to a portion which is intended to be exposed. In this case, the opening may be constructed in such a manner that the coating layer 115 is not constructed in the portion to which the diazo film is attached. In addition, the opening of the coating layer 115 may also be implemented using a method of removing the coating.

According to various embodiments, the camera module 100 may further include the conductive member 160. The image sensor 120 may be mounted on the conductive member 160. The conductive member 160 may be attached to the substrate 111 of the PCB 110 by using an adhesive layer 170 interposed between the conductive member 160 and the PCB 110.

The conductive member 160 according to various embodiments may be molded in a plate shape. The conductive member 160 may be constructed to have a specific thickness and thus have specific rigidity and hardness. The specific rigidity and hardness provided by the plate-shaped conductive member 160 may allow the image sensor 120 to be reliably mounted on the substrate 111 of the PCB 110, and may prevent resolution deterioration caused by an external impact. That is, the specific rigidity and hardness provided by the conductive member 160 and the coating layer 115 of the substrate 111 may be helpful to reliably mount the image sensor 120 on the substrate 111 so that the lens assembly 140 and an optical axis X are aligned, even though the substrate 111 is constructed as a flexible PCB. Therefore, the conductive member 160 may be referred to as a reinforcement member.

According to various embodiments, the conductive member 160 may be molded in a substantially square plate shape. The conductive member 160 may have a smaller size than the substrate 111 so as not to cover the bonding pad 114 or the like on the substrate 111. However, the embodiment is not limited thereto, and thus the conductive member 160 may have any suitable shape according to a shape of the substrate 111. In addition, a protrusion may be included in each corner to contribute to the rigidity and hardness of the substrate 111 constructed as the PCB while not covering connection pads such as the bonding pad 114.

The conductive member 160 according to various embodiments may be constructed of a conductive material. For example, the conductive member 160 may be constructed of a metallic material such as stainless steel, nickel silver, or the like. The metallic conductive member 160 may be electrically coupled to a ground layer in the PCB 110, thereby widening a ground area. That is, the metallic conductive member 160 may improve grounding performance by being electrically coupled to the ground layer in the PCB 110, thereby effectively shielding the image sensor 120 from an electromagnetic wave. Accordingly, the conductive member 160 may prevent performance deterioration of the camera module 110, caused by noise or static electricity which occurs due to an electronic component disposed adjacent to the camera module 100. Therefore, the conductive member 160 may be referred to as a ground member or a reinforcement member.

According to various embodiments, the adhesive layer 170 may be interposed between the substrate 111 and the conductive member 160 so that the conductive member 160 is attached on the substrate 111. The adhesive layer 170 may have a specific thickness. However, if the adhesive layer 170 has a thickness thicker than a proper thickness, thickness deviation and positional deviation of the adhesive layer 170 or shearing which may occur during a bonding process may cause an inclination phenomenon in which the conductive member 160 and the substrate 111 are not parallel but inclined. Upon occurrence of the inclination phenomenon, when light received from a lens and the image sensor 120 mounted on the conductive member 160 is misaligned to an optical axis X of the image sensor, there may be a problem of deterioration in the resolution of the entire image processed by the image sensor or the resolution of a specific corner. Therefore, the thickness of the adhesive layer 170 may be minimized while the adhesive layer 170 has sufficient adhesive force such that the conductive member 160 can be attached to the substrate 111. According to an embodiment, the adhesive layer 170 may preferably have a thickness less than or equal to 25 μm.

According to various embodiments, the conductive member 160 may be electrically coupled to the ground portion 117 of the substrate 111. For example, it may be electrically coupled directly by a conductive adhesive layer interposed between the conductive member 160 and the substrate 111. In general, the conductive adhesive layer may have a thickness of 40~60 μm. The conductive adhesive layer having the thickness of 40~60 μm may cause the inclination phenomenon of the image sensor 120 due to the thickness deviation, the positional deviation, and the shearing. Therefore, the conductive member 160 according to various embodiments may be interposed between the substrate 111 and the conductive member 160, and may be attached on the substrate 111 by using a non-conductive adhesive layer having a thickness less than or equal to 25 μm. For example, the non-conductive adhesive layer may include a thermosetting epoxy resin, a phenol resin, and a urethane resin. Alternatively, the non-conductive adhesive layer may include an adhesive film generated with a thermoplastic resin. Hereinafter, an embodiment in which the conductive member 160 is electrically coupled to the ground portion 117 of the substrate 111 will be described by assuming a case where the conductive member 160 is attached to the substrate 111 by using the non-conductive adhesive layer.

According to various embodiments, the conductive member 160 may include a first opening 161 constructed at a location corresponding to the ground portion 117. In addition, the adhesive layer 170 may include a second opening 171 constructed at a location corresponding to the ground portion 117. For example, the first opening 161 and the second opening 171 may be constructed in a circular shape. For another example, the first opening 161 and the second opening 171 may be constructed in various shapes such as a triangle, a square, or the like. According to various embodiments, the ground portion 117 may be exposed to the outside by means of the first opening 161 and the second opening 171.

According to various embodiments, the ground portion 117 may be electrically coupled to the conductive member 160 by filling a cavity constructed by the first opening 161 and the second opening 171 with a conductive material. For example, the cavity constructed by the first opening 161 and the second opening 171 may be filled with a solder. In other words, the ground portion 117 may be electrically coupled to the conductive member 160 through soldering. In other words, an electrical connection structure between the conductive member 160 and the ground portion 117 may be connected directly by a conductive adhesive layer. However, even if a non-conductive adhesive layer thinner than a conductive adhesive layer is used, a ground structure of a camera module may be implemented through soldering in an opening constructed at each of the conductive member 160 and the non-conductive adhesive layer 170.

The ground portion 117 may be electrically coupled to a ground signal electrode pattern in the PCB 110, or the ground signal electrode pattern may be partially exposed to the outside. According to an embodiment, the ground portion 117 may be disposed to a central region of the substrate 111. However, the embodiment is not limited thereto, and thus the ground portion 117 may be located at various points on the substrate 111. For example, the ground portion 117 may be disposed to an outer region of the substrate 111. In addition, the first opening 161 of the conductive member 160 and the second opening 171 of the adhesive layer 170 may be respectively located at the conductive member 160 and the adhesive layer 170 to correspond to a location of the ground portion 117 disposed to the outer region of the substrate 111. A specific ground structure according to various embodiments of the disclosure will be described in detail with reference to FIG. 2.

The image sensor 120 according to various embodiments may be mounted on the substrate 111 of the PCB 110. The image sensor 120 may include a solid-state image sensor. For example, the image sensor 120 may include a Complementary Metal-Oxide Semiconductor (CMOS) sensor or a Charge Coupled Device (CCD) sensor. The image sensor 120 may form an image from subject's light which has passed through at least one lens of the lens assembly 140. If the image sensor 120 is a CMOS sensor, electrons generated by the light from which the image is formed may be converted into voltage in a pixel in each image sensor and then may be output through several CMOS switches. Alternatively, if the image sensor 120 is a CCD sensor, the electrons generated by the light from which the image is formed may be moved directly to an output portion.

The optical filter member 130 may be provided to remove a wavelength of a near-infrared region. Specifically, the camera module 100 may output a subject's light signal received through at least one lens of the lens assembly 140 by changing it into an electrical signal by using the image sensor 120. The light signal received by the image sensor 120 may include not only a visible light region (400~700 nm) which is visible to human eyes but also a near-infrared region (700~1150 nm), and may saturate the image sensor to degrade performance of the image sensor irrespective of an image or color of an actual subject. Therefore, the optical filter member 130 disposed between the image sensor 120 and at least one lens of the lens assembly 140 may allow the image sensor 120 to receive light with only a wavelength of the visible light region by removing wavelengths of a near infrared region of the light signal. That is, the optical filter member 130 may be referred to as an infrared filter member.

The lens assembly 140 may be a tubular-shaped member which is penetrated vertically. Therefore, the lens assembly 140 may be referred to as a tube or a barrel. An outer circumferential face of the lens assembly 140 may include a shape corresponding to a fastening structure of an upper inner side of the housing 150. For example, the outer circumferential face of the lens assembly 140 may include a screw thread structure, and the upper inner side of the housing 150 may include a screw groove structure to be fastened to the screw thread of the lens assembly 140. In addition, at least one lens for receiving an image of a subject may be included inside the lens assembly 140.

The housing 150 according to various embodiments may be constructed in a vertical tubular shape providing an inner space in which various components of the camera module 100 are assembled. The housing 150 may be constructed of a plastic material or a metal material. However, at least an outer face of the housing 150 is preferably constructed of a conductive material for electromagnetic resistance of the camera module 100. Alternatively, an insulation film may be further constructed on an inner face of the housing 150. That is, the housing 150 may include a body constructed of an insulation material and a conductive film constructed on an outer face of the body. The insulation material may include Liquid Crystal Polymer (LCP), polycarbonate, or polyphenylsulfide, and the conductive film may include at least one element among first-group elements consisting of nickel, tin, copper, gold, and silver. In addition, the housing 150 according to various embodiments may shield an electromagnetic wave by grounding an additional external wire to another ground pad. Alternatively, the housing 150 may be electrically coupled together with physical coupling with the PCB 110 through the coupling hole 116. For example, the housing 150 may be coupled to the PCB 110 at an outer boundary through the coupling hole 116. In addition, the housing 150 may be electrically coupled to a ground signal electrode pattern in the PCB 110 through an electrical connection path in the coupling hole 116, thereby providing a function of shielding an electromagnetic wave. That is, the housing 150 may improve resistance of the electromagnetic wave of the camera module 100 together with the conductive member 160 and the ground signal electrode pattern in the PCB 110. In addition, a structure that can be fastened to the lens assembly 140 may be included in an upper inner side of the housing 150 according to various embodiments. For example, a screw fastening structure capable of screwing the lens assembly 140 may be included in an upper inner side of the housing 150.

Figure 2:
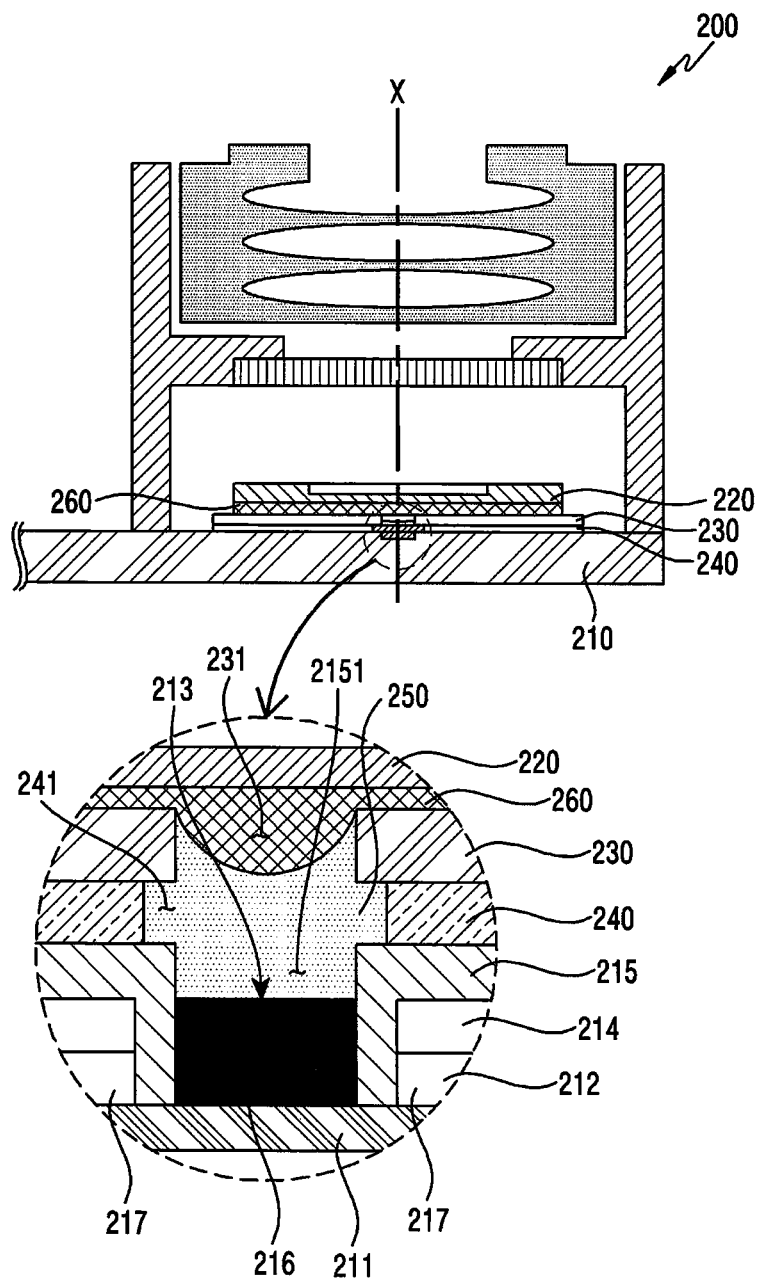
FIG. 2 is a cross-sectional view illustrating a structure in which a conductive member is mounted on a camera module of FIG. 1 according to various embodiments of the disclosure.

FIG. 2 is a cross-sectional view illustrating a structure in which a conductive member is mounted on a camera module of FIG. 1 according to various embodiments of the disclosure. Referring to FIG. 2, a camera module 200 according to various embodiments may include a PCB 210. For example, the PCB 210 may be a flexible PCB. A conductive member 230 and an image sensor 220 disposed on the conductive member 230 may be sequentially disposed on the PCB 210. The conductive member 230 may be attached to the PCB 210 by means of an adhesive layer 240. In addition, the image sensor 220 may be attached to the conductive member 230 by means of a sensor adhesive layer 260.

According to various embodiments, a ground portion 213 constructed to be exposed may be included in at least part of the PCB 210. The conductive member 230 may be disposed to the PCB 210 to cover the ground portion 213, and may include a first opening 231 at a portion where the ground portion 213 is located. The adhesive layer 240 may be interposed between the conductive member 230 and the PCB 210 to provide adhesive force, and may include a second opening 241 at a portion where the ground portion 213 is located. The conductive member 230 may be electrically coupled to the ground portion 213 by filling a cavity constructed by the first opening 231 and the second opening 241 with a conductive material. For example, the cavity constructed by the first opening 231 and the second opening 241 may be filled with a solder 250. The solder 250 may be a medium of an electrical connection of the ground portion 213 and the conductive member 230. In other words, the conductive member 230 may be electrically coupled to the ground portion 213 through soldering processed in the first opening 231 and the second opening 241. A ground area may be extended while the conductive member 230 is electrically coupled to the ground portion 213.

The conductive member 230 may be attached to the PCB 210 by using the non-conductive adhesive layer 240 thinner than a conductive adhesive layer, thereby implementing a slim camera module while preventing an inclination phenomenon caused by thickness deviation, positional deviation, and shearing which may occur when a thick adhesive layer is used. In addition, the conductive member 230 may be electrically coupled to the ground portion 213 through soldering processed in the first opening 231 and the second opening 241 constructed respectively in the conductive member 230 and the adhesive layer 240. Accordingly, a ground area is increased to improve an electromagnetic wave shielding effect.

According to various embodiments, a size of the first opening 231 may be substantially the same as a size of the ground portion 213. The size of the second opening 241 may be greater than the sizes of the ground portion 213 and first opening 231. During a process of bonding the conductive member 230 to the PCB 210, there may be a tolerance between a center of the ground portion 213 and a center of the second opening 241. If the size of the second opening 241 is equal to or less than the size of the ground portion 213, an exposed area of the ground portion 213 may be decreased due to the tolerance. Otherwise, if the size of the second opening 241 is greater than the size of the ground portion 213, the entire area of the ground portion 213 may be exposed even if the tolerance exists during the process of bonding the conductive member 230. Therefore, a sufficient amount of the solder 250 may be in contact with the ground portion 213 in a soldering process. That is, due to a size difference between the first opening 231 and the second opening 241, the ground portion 213 may be sufficiently filled with the solder 250 so that the conductive member 230 is electrically coupled with a sufficient area to the ground portion 213.

The solder 250 may be constructed not to protrude to a surface of the conductive member 230. For example, the solder 250 may be constructed to be filled as much as a specific height of the first opening 231 of the conductive member 230. Therefore, the image sensor 220 mounted on an upper face of the conductive member 230 may be attached to be parallel to the PCB 210. For example, the image sensor 220 may be attached closely in contact with the conductive member 230 by means of the sensor adhesive layer 260 without interference of the solder 250.

According to various embodiments, the PCB 210 may have a multi-layer structure. For example, the PCB 210 may include an insulation layer 211, a circuit layer 212, and a copper plated layer 214. The circuit layer 212 may construct electrode patterns 217 such that main circuits are electrically coupled to the image sensor 220, the lens assembly, or the like. In addition, the circuit layer 212 may construct a ground signal electrode pattern 216. The ground signal electrode pattern 216 may provide a function of shielding an electromagnetic wave generated unnecessarily in the electric signal electrode pattern 217. The copper plated layer 214 according to various embodiments may be constructed on an upper surface of the circuit layer 212 to provide a function of protecting the circuit layer 212.

According to various embodiments, the ground portion 213 may be constructed on at least part of the PCB 210. The ground portion 213 may electrically couple the conductive member 230 and the ground signal electrode pattern 216 of the circuit layer 212. Accordingly, a ground area is extended to improve an electromagnetic wave shielding effect. The ground portion 213 may be constructed in such a manner that at least part of the copper plated layer 214 and/or the circuit layer 212 are removed to expose the ground signal electrode pattern 216. For example, the ground portion 213 may be constructed by an opening 2151 constructed in at least part of the copper plated layer 214 and/or the circuit layer 212. The opening 2151 may be constructed by peeling at least part of the copper plated layer 214 and/or the circuit layer 212 or may be constructed in a hole shape.

According to various embodiments, the PCB 210 may further include a coating layer 215 laminated on the copper plated layer 214. The coating layer 215 may provide specific rigidity and hardness to the flexible PCB 210. In addition, the coating layer 215 may provide durability under a physical and chemical environment to the PCB 210 on which the copper plated layer 214 is constructed. For example, the coating layer may be a PSR printed layer. According to various embodiments, the coating layer 215 may be constructed to be coated on an inner lateral face of the opening 2151 constructed in the copper plated layer 214 and/or the circuit layer 212, such that the electric signal electrode pattern 217 is exposed. However, the embodiment is not limited thereto, and the PCB 210 may be constructed to have a multi-layer structure in which an insulation layer, a circuit layer, a copper plated layer, and a coating layer are also included in a rear face similarly to a front face.

Figure 3:
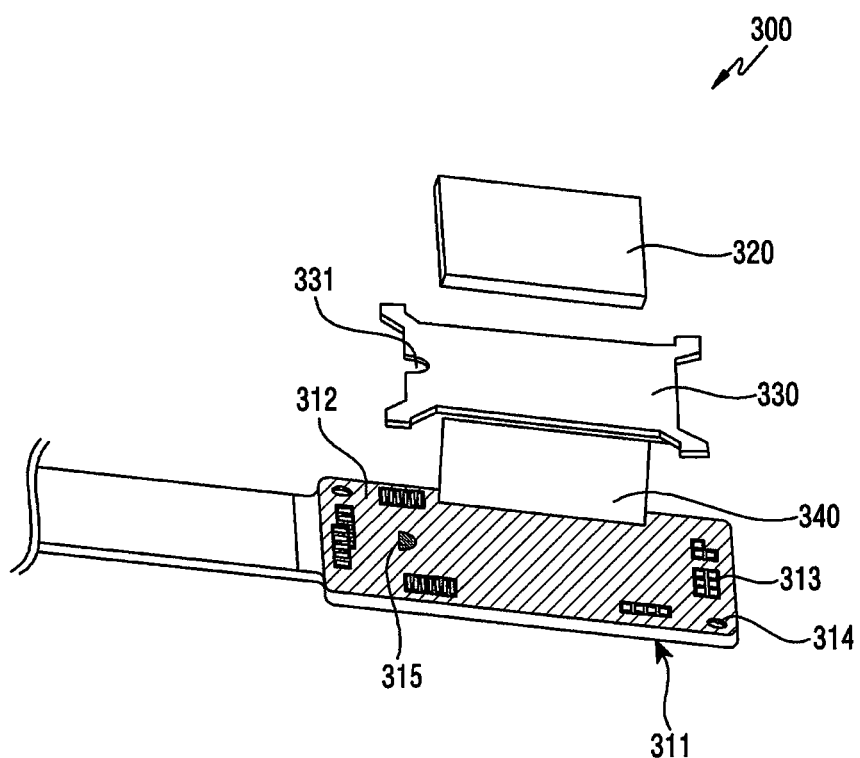
FIG. 3 is a perspective view illustrating a ground structure of a conductive member of a camera module according to various embodiments of the disclosure.

FIG. 3 is a perspective view illustrating a ground structure of a conductive member of a camera module according to various embodiments of the disclosure. Referring to FIG. 3, a camera module 300 may include a PCB 311, a conductive member 330, an image sensor 320 mounted on the conductive member 330, and an adhesive layer 340 interposed between the conductive member 330 and the PCB 311. Meanwhile, detailed descriptions on the same or similar configurations as those described in FIG. 1 or FIG. 2 will be omitted.

According to various embodiments, a location of a ground portion 315 constructed on the PCB 311 may correspond to a location of a boundary portion of the conductive member 330. Therefore, the conductive member 330 may include an opening 331 at a location corresponding to the ground portion 315 on the PCB 311. For example, the opening 331 may be constructed as a recessed cutout at an edge of the conductive member 330. The recessed cutout according to various embodiments may be constructed in various shapes such as a semi-circle, a triangle, a square, or the like.

According to various embodiments, the adhesive layer 340 used to attach the conductive member 330 on the PCB 311 may be constructed in a shape which does not cover the ground portion 315. For example, the adhesive layer 340 may be smaller in size than the conductive member 330. In this case, the conductive member 330 may be mounted on the PCB 311 through the following process. First, on a rear face of the conductive member 330 manufactured to include the opening 331, the adhesive layer 340 having a smaller size than the conductive member 330 may be attached not to cover the opening 331 of the conductive member 330. Secondly, the conductive member 330 and the adhesive layer 340 may be attached such that a location of the opening 331 corresponds to the ground portion 315 of the PCB 311. According to various embodiments, the image sensor 320 may be mounted at a substantially center of the conductive member 330. Therefore, when the opening 331 to be electrically coupled to the ground portion 315 is located at a boundary portion of the conductive member 330, the image sensor 320 may be mounted not to cover the opening 331. In other words, the ground portion 315 of the PCB 311 and the opening 331 of the conductive member 330 may be constructed in respective regions not overlapping with a region in which the image sensor 320 is mounted. Therefore, the adhesive layer 340 may not include an opening for soldering, thereby providing an advantage of time saving and manufacturing cost reduction in the process of constructing the opening in the adhesive layer 340.

According to various embodiments, the ground portion 315 and the conductive member 330 may be electrically coupled by filling a cavity constructed by the opening 331 with a conductive material. For example, the cavity constructed by the opening 331 may be filled with a solder. The solder may be a medium of an electrical connection of the ground portion 315 and the conductive member 330. In other words, the conductive member 330 may be electrically coupled to the ground portion 315 through soldering processed in the opening 331. A ground area may be extended while the conductive member 330 is electrically coupled to the ground portion 315. In this case, the solder may be constructed not to protrude to a surface of the conductive member 330. For example, the solder may be constructed to be filled as much as a specific height of the opening 331 of the conductive member 330. For another example, the solder may be completely filled in the opening 331 of the conductive member 330 and thus may be constructed to more protrude than the surface of the conductive member 330. If the opening 331 is constructed in a region not overlapping with a region in which the image sensor 320 is mounted in the conductive member 330, even if the solder is constructed to more protrude than the surface of the conductive member 330, it may not be interfered when the image sensor 320 is mounted in the conductive member 330. If the solder is constructed to more protrude than the surface of the conductive member 330, the solder may provide fixing force by which the conductive member 330 is attached to the PCB 311 while providing the electrical connection of the ground portion 315 with the conductive member 330.

Figure 4:
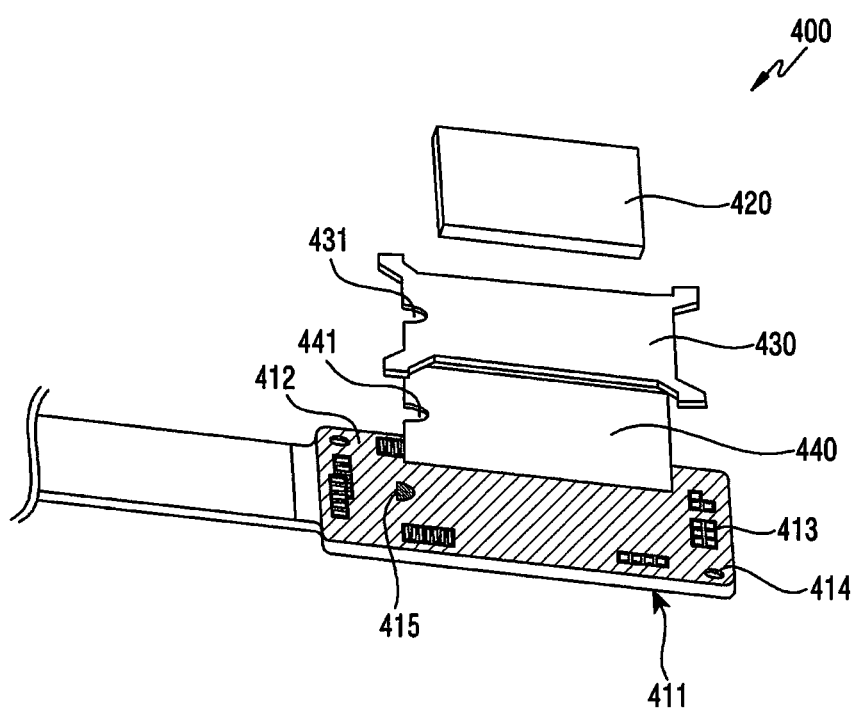
FIG. 4 is a perspective view illustrating a ground structure of a conductive member of a camera module according to various embodiments of the disclosure.

FIG. 4 is a perspective view illustrating a ground structure of a conductive member of a camera module according to various embodiments of the disclosure. Referring to FIG. 4, a camera module 400 may include a PCB 411, a conductive member 430, an image sensor 420 mounted on the conductive member 430, and an adhesive layer 440 interposed between the conductive member 430 and the PCB 411. Meanwhile, detailed descriptions on the same or similar configurations as those described in FIG. 1, FIG. 2, or FIG. 3 will be omitted.

According to various embodiments, a location of a ground portion 415 constructed on the PCB 411 may correspond to a location of a boundary portion of the conductive member 430. Therefore, the conductive member 430 may include a first opening 431 at a location corresponding to the ground portion 415 on the PCB 411. For example, the first opening 431 may be constructed as a recessed cutout at an edge of the conductive member 430. The recessed cutout according to various embodiments may be constructed in various shapes such as a semi-circle, a triangle, a square, or the like.

According to various embodiments, the adhesive layer 440 used to attach the conductive member 430 on the PCB 411 may be constructed in a shape which can cover the conductive member 430 and the ground portion 415. For example, the adhesive layer 440 may have substantially the same size as that of the conductive member 430. The adhesive layer 440 may include the first opening 431 of the conductive member 430 and a second opening 441 constructed at a location corresponding to the first opening 431 and the ground portion 415. In this case, the image sensor 420 and the conductive member 430 may be mounted on the PCB 411 through a process in which the adhesive layer 440 is attached on a rear face of the conductive member 430 such that a location of the first opening 431 corresponds to a location of the second opening 441, and the conductive member 430 and the conductive layer 440 are attached on an upper face of the PCB 411 such that locations of the openings 431 and 441 correspond to a location of the ground portion 415.

According to various embodiments, the image sensor 420 may be mounted at a substantially center of the conductive member 430. Therefore, when the opening 431 to be electrically coupled to the ground portion 415 is located at a boundary portion of the conductive member 430, the image sensor 420 may be mounted not to cover the first opening 431. In other words, the ground portion 415 of the PCB 411 and the first opening 431 of the conductive member 430 and the second opening 441 of the adhesive layer 400 may be constructed in respective regions not overlapping with a region in which the image sensor 420 is mounted.

According to various embodiments, the ground portion 415 and the conductive member 430 may be electrically coupled by filling a cavity constructed by the first opening 431 and the second opening 441 with a conductive material. For example, the cavity constructed by the opening 431 may be filled with a solder. The solder may be a medium of an electrical connection of the ground portion 415 and the conductive member 430. In other words, the conductive member 430 may be electrically coupled to the ground portion 415 through soldering processed in the opening 431. A ground area may be extended while the conductive member 430 is electrically coupled to the ground portion 415. In this case, the solder may be constructed not to protrude to a surface of the conductive member 430. For example, the solder may be constructed to be filled as much as a specific height of the first opening 431 of the conductive member 430. For another example, the solder may be completely filled in the opening 431 of the conductive member 430 and thus may be constructed to more protrude than the surface of the conductive member 430. If the opening 431 is constructed in a region not overlapping with a region in which the image sensor 420 is mounted in the conductive member 430, even if the solder is constructed to more protrude than the surface of the conductive member 430, it may not be interfered when the image sensor 420 is mounted in the conductive member 430. If the solder is constructed to more protrude than the surface of the conductive member 430, the solder may provide fixing force by which the conductive member 430 is attached to the PCB 411 while providing the electrical connection of the ground portion 415 with the conductive member 430.

Figure 5:
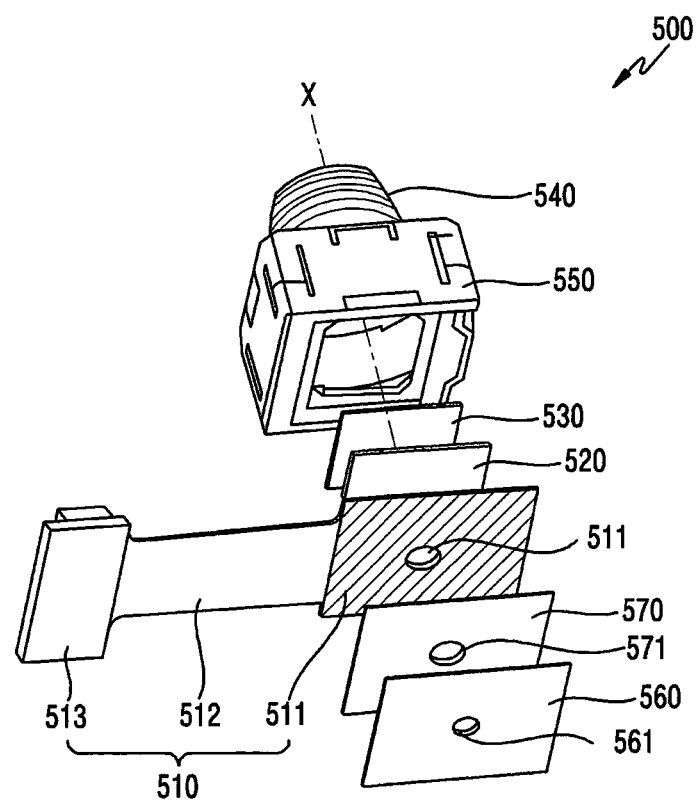
FIG. 5 is an exploded perspective view of a camera module, viewed from a rear face thereof, according to various embodiments of the disclosure.

FIG. 5 is an exploded perspective view of a camera module, viewed from a rear face thereof, according to various embodiments of the disclosure. Referring to FIG. 5, a camera module 500 according to various embodiments may include a PCB 510, an image sensor 520 mounted on one end portion of the PCB 510, an optical filter member 530, a lens assembly 540, a housing 550, and a conductive member 560. The housing 550 may be constructed in a vertical tubular shape to provide an inner space in which various components of the camera module 500 are assembled. A substrate 511 of the PCB 510 may be fixedly coupled to cover an open lower face of the housing 550. The image sensor 520 may be mounted on an upper face of the PCB 510. In addition, the optical filter member 530 and the lens assembly 540 may be mounted inside the housing 550. Meanwhile, the conductive member 560 may be attached to a rear face of the substrate 511. Detailed descriptions on the same or similar configurations as those described in FIG. 1 and FIG. 2 will be omitted.

According to various embodiments, the camera module 500 may further include the conductive member 560. The image sensor 520 may be mounted on an upper face of a substrate 511 of the PCB 510, and the conductive member 560 may be attached to a rear face of the substrate 511. For example, the conductive member 560 may be attached to the rear face of the substrate 511 of the PCB 510 by using an adhesive layer 570 interposed between the substrate 511 and the conductive member 560.

The conductive member 560 according to various embodiments may be molded in a plate shape. The conductive member 560 may be constructed to have a specific thickness and thus have specific rigidity and hardness. Due to the specific rigidity and hardness provided by the plate-shaped conductive member 560, the image sensor 520 may be reliably mounted on the substrate 511 of the PCB 510 despite a property in which the PCB is bendable by an external impact. That is, the specific rigidity and hardness provided by the conductive member 560 attached to the substrate 511 may be helpful to reliably mount the image sensor 520 on the substrate 511 so that the lens assembly 540 and an optical axis X are aligned, even though the substrate 511 is constructed as a flexible PCB. Therefore, the conductive member 560 may be referred to as a reinforcement member.

According to various embodiments, the conductive member 560 may be molded in a substantially square plate shape. However, unlike in an upper face, since a lower face of the substrate 511 does not include a bonding pad or the like, the conductive member 560 may have substantially the same size as the substrate 511. In addition, since there is no connection pad or the like such as the bonding pad of the upper face of the substrate 511, the conductive member 560 may be configured to have substantially the same shape and size as the substrate 511.

The conductive member 560 according to various embodiments may be constructed of a conductive material. For example, the conductive member 560 may be constructed of a metallic material such as stainless steel, nickel silver, or the like. The metallic conductive member 560 may be electrically coupled to a ground layer in the PCB 510, thereby widening a ground area. That is, the metallic conductive member 560 may improve grounding performance by being electrically coupled to a ground portion (or a ground signal electrode pattern) in the PCB 510, thereby effectively shielding the image sensor 520 from an electromagnetic wave. That is, a normal operation of the camera module 500 may not be affected by noise or static electricity which occurs due to components of the electronic device, which may be disposed adjacent to the camera module 500. Therefore, the conductive member 560 may be referred to as a ground member or a reinforcement member.

According to various embodiments, the adhesive layer 570 may be interposed between the substrate 511 and the conductive member 560 so that the conductive member 560 is attached on the substrate 511. The adhesive layer 570 may have a specific thickness. However, if the adhesive layer 570 has a thickness thicker than a proper thickness, thickness deviation and positional deviation of the adhesive layer 570 or shearing which may occur during a bonding process may cause an inclination phenomenon in which the conductive member 560 and the substrate 511 are not parallel but inclined. Upon occurrence of the inclination phenomenon, when light received from a lens and the image sensor 520 mounted on the conductive member 560 is misaligned to an optical axis X of the image sensor, there may be a problem of deterioration in the resolution of the entire image processed by the image sensor or the resolution of a specific corner. Therefore, the thickness of the adhesive layer 570 may be minimized while the adhesive layer 570 has sufficient adhesive force such that the conductive member 560 can be attached to the substrate 511. The adhesive layer 570 may preferably have a thickness less than or equal to 25 μm.

According to various embodiments, the conductive member 560 may be electrically coupled to the ground portion 514 of the substrate 511. For example, it may be electrically coupled directly by a conductive adhesive layer interposed between the conductive member 560 and the substrate 511. In general, the conductive adhesive layer may have a thickness of 40~60 μm. Therefore, if the ground portion 514 of the substrate 511 is electrically coupled directly to the conductive member 560 by using a conductive adhesive layer, an inclination phenomenon of the image sensor 520 may occur due to the thickness deviation, positional deviation, and shearing of the conductive adhesive layer. Therefore, the conductive member 560 according to various embodiments may be interposed between the substrate 511 and the conductive member 560, and may be attached on the substrate 511 by using a non-conductive adhesive layer having a thickness less than or equal to 25 μm. For example, the non-conductive adhesive layer may include a thermosetting epoxy resin, a phenol resin, and a urethane resin. Alternatively, the non-conductive adhesive layer may include an adhesive film generated with a thermoplastic resin. Hereinafter, an embodiment in which the conductive member 560 is electrically coupled to the ground portion 514 of the substrate 511 will be described by assuming a case where the conductive member 560 is attached to the substrate 511 by using the non-conductive adhesive layer.

According to various embodiments, the conductive member 560 may include a first opening 561 constructed at a location corresponding to the ground portion 514. In addition, the adhesive layer 570 may include a second opening 571 constructed at a location corresponding to the ground portion 514. For example, the first opening 561 and the second opening 571 may be constructed in a circular shape. For another example, the first opening 561 and the second opening 571 may be constructed in various shapes such as a triangle, a square, or the like. According to various embodiments, the ground portion 514 may be exposed to the outside by means of the first opening 561 and the second opening 571.

According to various embodiments, the conductive member 560 may be electrically coupled to the ground portion 514 by filling a cavity constructed by the first opening 561 and the second opening 571 with a conductive material. For example, the cavity constructed by the first opening 561 and the second opening 571 may be filled with a solder. In other words, the conductive member 560 may be electrically coupled to the ground portion 514 through soldering. In other words, an electrical connection structure between the conductive member 560 and the ground portion 514 may be connected directly by a conductive adhesive layer. However, even if a non-conductive adhesive layer thinner than a conductive adhesive layer is used, a ground structure of a camera module may be implemented through soldering in an opening constructed at each of the conductive member 560 and the non-conductive adhesive layer 570:

The ground portion 514 may be electrically coupled to a ground signal electrode pattern in the PCB 510, or the ground signal electrode pattern may be partially exposed to the outside. According to various embodiments, the ground portion 514 may be disposed to a central region of the substrate 511. However, the embodiment is not limited thereto, and thus the ground portion 514 may be located at various points on the substrate 511. For example, the ground portion 514 may be disposed to an outer region of the substrate 511. In addition, the first opening 561 of the conductive member 560 and the second opening 571 of the adhesive layer 570 may be respectively located at the conductive member 560 and the adhesive layer 570 to correspond to a location of the ground portion 514 disposed to the outer region of the substrate 511. A specific ground structure of a camera module according to various embodiments of the disclosure will be described in detail with reference to FIG. 6.

Figure 6:
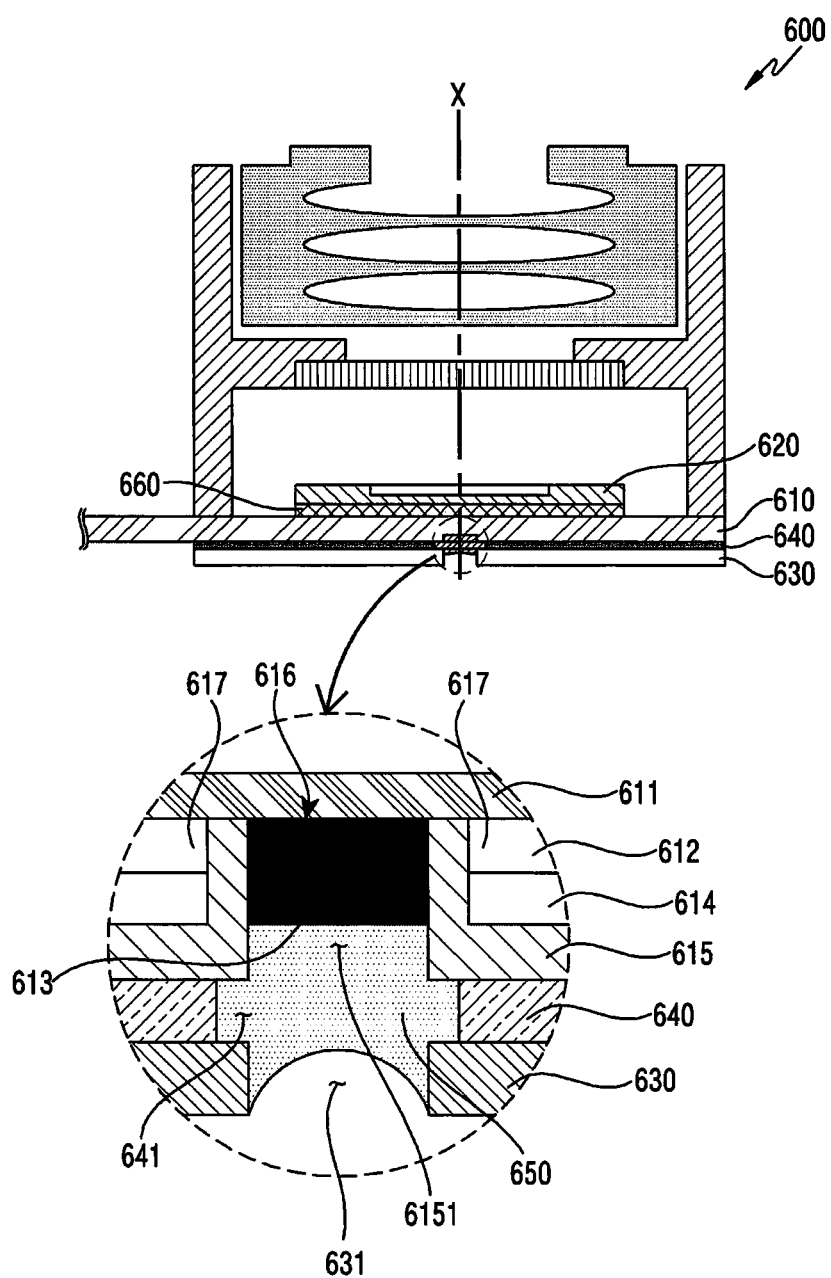
FIG. 6 is a cross-sectional view illustrating a structure in which a conductive member is mounted on a camera module of FIG. 5 according to various embodiments of the disclosure.

FIG. 6 is a cross-sectional view illustrating a structure in which a conductive member is mounted on a camera module of FIG. 5 according to various embodiments of the disclosure. Referring to FIG. 6, a camera module 600 according to various embodiments may include a PCB 610. For example, the PCB 610 may be a flexible PCB. An image sensor 620 may be mounted on an upper face of the PCB 610. For example, the image sensor 620 may be attached to the upper face of the PCB 610 by using a sensor adhesive layer 660. A conductive member 630 may be attached to a rear face opposite to the upper face on which the image sensor 620 is mounted on the PCB 610. For example, the conductive member 630 may be attached to the rear face of the PCB 610 by using an adhesive layer 640. Hereinafter, detailed descriptions on the same or similar configurations as those described in FIG. 1 or FIG. 5 will be omitted.

According to various embodiments, the PCB 610 may include a ground portion 613 constructed such that at least part of a ground signal electrode pattern included in the PCB 610 is exposed on a rear face. The conductive member 630 may be disposed to the PCB 610 to cover the ground portion 613, and may include a first opening 631 at a portion where the ground portion 613 is located. The adhesive layer 640 may be interposed between the conductive member 630 and the rear face of the PCB 610 to provide adhesive force, and may include a second opening 641 at a portion where the ground portion 613 is located. The conductive member 630 may be electrically coupled to the ground portion 613 by filling a cavity constructed by the first opening 631 and the second opening 641 with a conductive material. For example, the cavity constructed by the first opening 631 and the second opening 641 may be filled with a solder 650. The solder 650 may be a medium of an electrical connection of the ground portion 613 and the conductive member 630. In other words, the conductive member 630 may be electrically coupled to the ground portion 613 through soldering processed in the first opening 631 and the second opening 641. A ground area may be extended while the conductive member 630 is electrically coupled to the ground portion 613.

The conductive member 630 may be attached to the PCB 610 by using the non-conductive adhesive layer 640 thinner than a conductive adhesive layer, thereby implementing a slim camera module while preventing an inclination phenomenon caused by thickness deviation, positional deviation, and shearing which may occur when a thick adhesive layer is used. In addition, the conductive member 630 may be electrically coupled to the ground portion 613 through soldering processed in the first opening 631 and the second opening 641 constructed respectively in the conductive member 630 and the adhesive layer 640. Accordingly, a ground area is increased to improve an electromagnetic wave shielding effect.

According to various embodiments, a size of the first opening 631 may be substantially the same as a size of the ground portion 613. The size of the second opening 641 may be greater than the sizes of the ground portion 613 and first opening 631. During a process of bonding the conductive member 630 to the PCB 610, there may be a tolerance between a center of the ground portion 613 and a center of the second opening 641. If the size of the second opening 641 is equal to or less than the size of the ground portion 613, an exposed area of the ground portion 613 may be decreased due to the tolerance. Otherwise, if the size of the second opening 641 is greater than the size of the ground portion 613, the entire area of the ground portion 613 may be exposed even if the tolerance exists during the process of bonding the conductive member 630. Therefore, a sufficient amount of the solder 650 may be in contact with the ground portion 613 in a soldering process. That is, due to a size difference between the first opening 631 and the second opening 641, the ground portion 613 may be sufficiently filled with the solder 650 so that the conductive member 630 is electrically coupled with a sufficient area to the ground portion 613.

According to various embodiments, the PCB 610 may have a multi-layer structure. For example, the PCB 610 may include an insulation layer 611, a circuit layer 612, and a copper plated layer 614. The circuit layer 612 may construct electrode patterns 617 such that main circuits are electrically coupled to the image sensor 620, the lens assembly, or the like. In addition, the circuit layer 612 may construct a ground signal electrode pattern 616. The ground signal electrode pattern 616 may provide a function of shielding an electromagnetic wave generated unnecessarily in the electric signal electrode pattern 617. The copper plated layer 614 according to various embodiments may be constructed on an upper surface of the circuit layer 612 to provide a function of protecting the circuit layer 612.

According to various embodiments, the ground portion 613 may be constructed on at least part of the PCB 610. The ground portion 613 may electrically couple the conductive member 630 and the ground signal electrode pattern 616 of the circuit layer 612. Accordingly, a ground area is extended to improve an electromagnetic wave shielding effect. The ground portion 613 may be constructed in such a manner that at least part of the copper plated layer 614 and/or the circuit layer 612 are removed to expose the ground signal electrode pattern 616. For example, the ground portion 613 may be constructed by an opening 618 constructed in at least part of the copper plated layer 614 and/or the circuit layer 612. The opening 618 may be constructed by peeling at least part of the copper plated layer 614 and/or the circuit layer 612 or may be constructed in a hole shape.

According to various embodiments, the PCB 610 may further include a coating layer 615 laminated on the copper plated layer 614. The coating layer 615 may provide specific rigidity and hardness to the flexible PCB 610. In addition, the coating layer 615 may provide durability under a physical and chemical environment to the PCB 610 on which the copper plated layer 614 is constructed. For example, the coating layer may be a PSR printed layer. According to various embodiments, the coating layer 615 may be constructed to be coated on an inner lateral face of the opening 618 constructed in the copper plated layer 614 and/or the circuit layer 612, such that the ground portion 613 is exposed. However, the embodiment is not limited thereto, and the PCB 610 may be constructed to have a multi-layer structure in which an insulation layer, a circuit layer, a copper plated layer, and a coating layer are also included in a front face similarly to a rear face.

Figure 7:
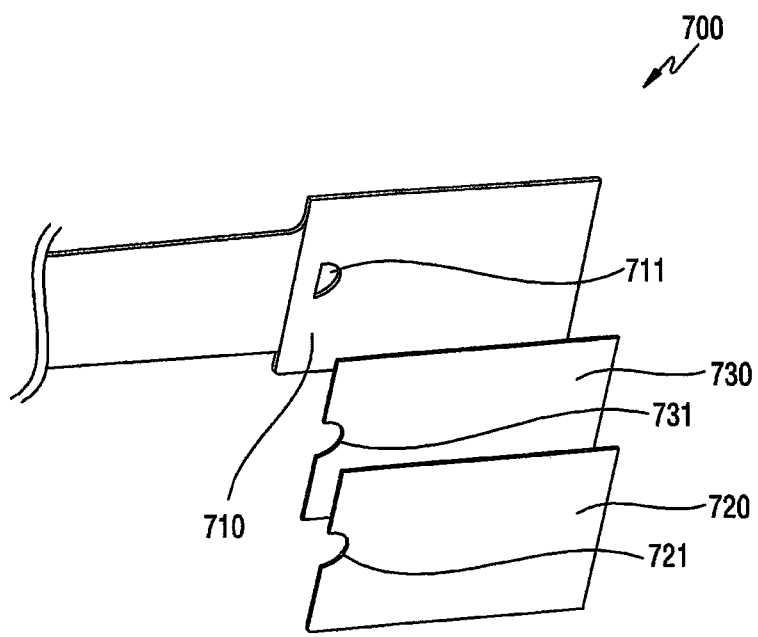
FIG. 7 is a perspective view illustrating a ground structure of a conductive member of a camera module according to various embodiments of the disclosure.

FIG. 7 is a perspective view illustrating a ground structure of a conductive member of a camera module according to various embodiments of the disclosure. Referring to FIG. 7, a camera module 700 according to various embodiments may include a PCB 710. An image sensor (not shown) may be mounted on an upper face of the PCB 710. A conductive member 720 may be attached to a rear face opposite to the upper face on which the image sensor (not shown) is mounted on the PCB 710. The conductive member 720 may be attached to the rear face of the PCB 710 by means of an adhesive layer 730. Meanwhile, detailed descriptions on the same or similar configurations as those described in FIG. 5 or FIG. 6 will be omitted.

According to various embodiments, a location of a ground portion 711 constructed on a rear face of the PCB 710 may correspond to a location of a boundary portion of the conductive member 720. Therefore, the conductive member 720 may include a first opening 721 at a location corresponding to the ground portion 711 on the PCB 710. For example, the first opening 721 may be constructed as a recessed cutout at an edge of the conductive member 720.

According to various embodiments, the adhesive layer 730 used to attach the conductive member 720 on the rear face of the PCB 710 may be constructed in a shape which can cover the conductive member 720 and the ground portion 711. For example, the adhesive layer 730 may have substantially the same size as that of the conductive member 720. The adhesive layer 730 may include the first opening 721 of the conductive member 720 and a second opening 731 constructed at a location corresponding to the first opening 721 and the ground portion 711. In this case, the conductive member 720 may be mounted on the PCB 710 through a process in which the adhesive layer 730 is attached on a rear face of the conductive member 720 such that a location of the first opening 721 corresponds to a location of the second opening 731, and the conductive member 720 and the conductive layer 730 are attached on the rear face of the PCB 710 such that locations of the openings 721 and 731 correspond to a location of the ground portion 711.

According to various embodiments, the ground portion 711 and the conductive member 720 may be electrically coupled by filling a cavity constructed by the first opening 721 and the second opening 731 with a conductive material. For example, the cavity constructed by the first and second openings 721 and 731 may be filled with a solder. The solder may be a medium of an electrical connection of the ground portion 711 and the conductive member 720. In other words, the conductive member 720 may be electrically coupled to the ground portion 711 through soldering processed in the first and second openings 721 and 731. A ground area may be extended while the conductive member 720 is electrically coupled to the ground portion 711. In this case, the solder may be constructed not to protrude to a surface of the conductive member 720, so that an outer surface of the conductive member 720 is flat, thereby providing easiness when the camera module 700 is mounted as a component in the electronic device. However, the embodiment is not limited to this, and the solder may be constructed to protrude from the surface of the conductive member 720 by filling up the opening 721 of the conductive member 720.

Figure 8:
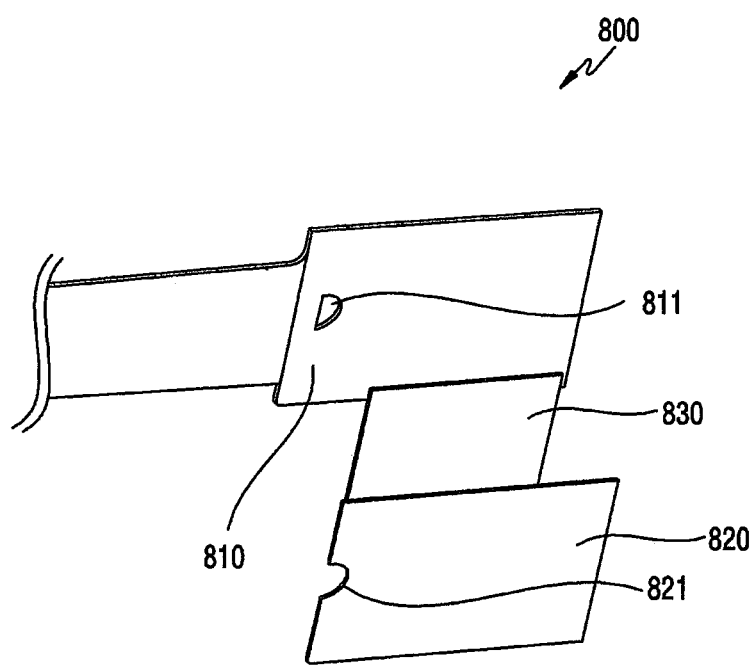
FIG. 8 is a perspective view illustrating a ground structure of a conductive member of a camera module according to various embodiments of the disclosure.

FIG. 8 is a perspective view illustrating a ground structure of a conductive member of a camera module according to various embodiments of the disclosure. Referring to FIG. 8, a camera module 800 according to various embodiments may include a PCB 810. An image sensor (not shown) may be mounted on an upper face of the PCB 810. A conductive member 820 may be attached to a rear face opposite to the upper face on which the image sensor (not shown) is mounted on the PCB 810. The conductive member 820 may be attached to the rear face of the PCB 810 by means of an adhesive layer 830 smaller in size than the conductive member 820. Meanwhile, detailed descriptions on the same or similar configurations as those described in FIG. 5, FIG. 6, or FIG. 7 will be omitted.

According to various embodiments, a location of a ground portion 811 constructed on the PCB 810 may correspond to a location of a boundary portion of the conductive member 820. Therefore, the conductive member 820 may include an opening 821 at a location corresponding to the ground portion 811 on the PCB 810. For example, the opening 821 may be constructed as a recessed cutout at an edge of the conductive member 820.

According to various embodiments, the adhesive layer 830 used to attach the conductive member 820 on the PCB 810 may be constructed in a shape which does not cover the ground portion 811. For example, the adhesive layer 830 may be manufactured to have a smaller size than the conductive member 820.

In other words, in the PCB 810 according to various embodiments, a region in which the ground portion 811 is constructed and a region in which the opening 821 is constructed in the conductive member 820 may be defined as a first region. In addition, in the PCB 810, a region in which the ground portion 811 is not constructed and a region in which the opening 821 is not constructed may be defined as a second region. In this case, the adhesive layer 830 may have a size overlapping with at least part of the second region while not overlapping with the first region. As such, the adhesive layer 830 may have a smaller size than the conductive member 820 so that the region including the ground portion 811 is attached without overlapping. Therefore, the adhesive layer 830 may not include an opening for soldering, thereby providing an advantage of time saving and manufacturing cost reduction in the process of constructing the opening in the adhesive layer 840.

A camera module according to various embodiments may include a printed circuit board, a ground portion constructed on the printed circuit board, a conductive member which is disposed to cover the ground portion and includes a first opening at a location corresponding to the ground portion, and an adhesive layer which is interposed between the printed circuit board and the conductive member and includes a second opening at a location corresponding to the ground portion. The conductive member may be electrically coupled to the ground portion through a solder constructed on the first opening and the second opening.

The second opening of the camera module according to various embodiments may be larger than the first opening.

The camera module according to various embodiments may further include an image sensor which is disposed on the conductive member. The ground portion and the first opening may be constructed in a region overlapping with the image sensor.

The camera module according to various embodiments may further include an image sensor which is disposed on the conductive member. The ground portion and the first opening may be constructed in a region not overlapping with the image sensor.

The first opening and second opening of the camera module according to various embodiments may be constructed in a boundary region of the conductive member.

The first opening and second opening of the camera module according to various embodiments may be constructed as a recessed cutout at an edge of each of the conductive member and the adhesive layer.

The camera according to various embodiments may further include an image sensor disposed on a face opposite to a face on which the conductive member of the printed circuit board is disposed. The first opening and the second opening may be constructed in a boundary region of the conductive member.

The first opening and second opening of the camera module according to various embodiments may be constructed as a recessed cutout at an edge of each of the conductive member and the adhesive layer.

The printed circuit board of the camera module according to various embodiments may include a circuit layer, a ground signal electrode pattern included in the circuit layer, and a coating layer which is constructed on the ground signal electrode pattern and includes an opening to expose part of the ground signal electrode pattern. The ground portion may be constructed in the opening.

The coating layer of the camera module according to various embodiments may include at least one of a copper plated layer and a Photo imageable Solder Resist (PSR) printed layer.

The conductive member of the camera module according to various embodiments may include stainless steel or nickel silver.

The adhesive layer of the camera module according to various embodiments may include a non-conductive adhesive layer.

A camera module according to various embodiments may include a printed circuit board, a ground portion constructed on the printed circuit board, a conductive member which is disposed to cover the ground portion and includes an opening at a location corresponding to the ground portion, and an adhesive layer which is interposed between the printed circuit board and the conductive member and does not overlap with the ground portion. The conductive member may be electrically coupled to the ground portion through a solder constructed on the opening.

Various embodiments of the disclosure disclosed in the specification and the drawing are merely a specific example presented for clarity and are not intended to limit the scope of the disclosure. Therefore, in addition to the embodiments disclosed herein, various changes in forms and details made without departing from the technical concept of the disclosure will be construed as being included in the scope of the disclosure.

What is claimed is:

1. A camera module comprising:
   a printed circuit board;
   a ground portion disposed at a given area of the printed circuit board;
   a conductive member disposed above the printed circuit board and including a first opening at a location corresponding to the ground portion;
   a non-conductive adhesive layer which is disposed between the printed circuit board and the conductive member and includes a second opening at a location corresponding to the ground portion, wherein the non-conductive adhesive layer attaches the conductive member to the printed circuit board;
   an image sensor disposed on the conductive member and covering a space including the first opening and the second opening; and
   a solder filled in the space, wherein the solder includes a first solder region and a second solder region,
   wherein the first solder region fills a specific height of the first opening of the conductive member and is formed concave compared to a surface of the conductive member,
   wherein the second solder region fills the second opening of the non-conductive adhesive layer, and
   wherein the conductive member is electrically coupled to the ground portion through at least the first solder region and the second solder region.

2. The camera module of claim 1, wherein the second opening is larger than the first opening.

3. The camera module of claim 1, wherein the ground portion and the first opening are disposed in a region overlapping with the image sensor.

4. The camera module of claim 1, wherein the first opening and the second opening are constructed in a boundary region of the conductive member.

5. The camera module of claim 4, wherein the first opening and the second opening are constructed as a recessed cutout at an edge of each of the conductive member and the non-conductive adhesive layer.

6. The camera module of claim 1, wherein the printed circuit board comprises:
   a circuit layer;
   a ground signal electrode pattern included in the circuit layer; and
   a coating layer which is disposed on the ground signal electrode pattern and includes a third opening to expose part of the ground signal electrode pattern,
   wherein the ground portion is constructed in the third opening.

7. The camera module of claim 1, wherein the conductive member includes stainless steel or nickel silver.

8. The camera module of claim 1, wherein the non-conductive adhesive layer includes a non-conductive adhesive film.

9. The camera module of claim 8, wherein the non-conductive adhesive layer has a thickness less than or equal to 25 μm.

10. The camera module of claim 9, wherein the image sensor and the conductive member are parallel to the printed circuit board.

11. The camera module of claim 1, wherein the conductive member includes a conductive plate.

12. The camera module of claim 1, wherein the conductive member is electrically coupled to the ground portion to increase a ground area.

13. The camera module of claim 1, wherein the conductive member is electrically coupled to the ground portion to shield the image sensor from an electromagnetic wave.

* * * * *